(12) United States Patent
Dougherty, Jr. et al.

(10) Patent No.: US 8,571,883 B2
(45) Date of Patent: Oct. 29, 2013

(54) IMAGE ANALYSIS PROCESSES AND METHODS FOR THE EVALUATION OF TAMPON PERFORMANCE

(75) Inventors: Eugene P. Dougherty, Jr., Camden-Wyoming, DE (US); Phil Ebert, Camden, DE (US); Shirley McCarthy, Brnford, CT (US); Mary Jane Minkin, Guilford, CT (US)

(73) Assignee: Eveready Battery Company, Inc., St. Louis, MO (US)

( * ) Notice: Subject to any disclaimer, the term of this patent is extended or adjusted under 35 U.S.C. 154(b) by 917 days.

(21) Appl. No.: 12/115,117

(22) Filed: May 5, 2008

(65) Prior Publication Data

US 2008/0294378 A1 Nov. 27, 2008

Related U.S. Application Data

(60) Provisional application No. 60/928,554, filed on May 10, 2007.

(51) Int. Cl.
   *G06Q 10/00* (2012.01)
(52) U.S. Cl.
   USPC .............................................. 705/2; 382/128
(58) Field of Classification Search
   USPC .......................................... 705/2, 3; 600/401
   See application file for complete search history.

(56) References Cited

U.S. PATENT DOCUMENTS

| | | | |
|---|---|---|---|
| 2002/0115976 A1 | 8/2002 | Fleming | |
| 2005/0192844 A1* | 9/2005 | Esler et al. | 705/3 |
| 2005/0273035 A1 | 12/2005 | Gann et al. | |
| 2005/0273036 A1* | 12/2005 | Osborn et al. | 604/11 |
| 2006/0025741 A1 | 2/2006 | Osborn, III et al. | |
| 2006/0058632 A1* | 3/2006 | McBurnett et al. | 600/410 |
| 2006/0118238 A1 | 6/2006 | Borazghi | |
| 2007/0016391 A1* | 1/2007 | Minoguchi et al. | 703/11 |
| 2007/0136098 A1* | 6/2007 | Smythe et al. | 705/3 |
| 2007/0167819 A1* | 7/2007 | Osborn et al. | 600/462 |
| 2008/0034849 A1* | 2/2008 | Honkonen et al. | 73/73 |
| 2008/0183450 A1* | 7/2008 | Macura et al. | 703/9 |

OTHER PUBLICATIONS

Pretorius et al., Use of MRI to determine the in vivo position of a silicone vaginal barrier contraceptive device, Contraception (2002) p. 343-346.*
Rubod et al., A biomechanical model of the pelvic cavity: first steps, EMBS Annual Conference, Aug. 30-Sep. 3, 2006.*
Farage, Miranda; et al., "Lifetime Changes in the Vulva and Vagina", Arch Gynecol Obstet; vol. 273, 2006, pp. 195-202.

(Continued)

*Primary Examiner* — Gerald J. O'Connor
*Assistant Examiner* — Jonathan K Ng
(74) *Attorney, Agent, or Firm* — Robert R. Rosasco, III; Russell H. Toye, Jr.

(57) ABSTRACT

A method for the study and evaluation of the performance of medical devices in vivo is disclosed. The medical devices are preferably tampons that are observed and evaluated in the vaginal cavities of women during their menstrual cycles in order to obtain data relative to tampon performance for the improvement of tampon technology. The method preferably uses magnetic resonance imaging (MRI), although other types of imaging techniques may be used. The present invention also resides in a method of MRI analysis in which a three-dimensional surface model image of a medical device such as a tampon or similar feminine hygiene product in vivo is created from two or more two-dimensional cross section images and combined with a second surface model image to produce a single image.

21 Claims, 15 Drawing Sheets

(56) References Cited

OTHER PUBLICATIONS

Parikh, Mansi; et al., "Three Dimensional Virtual Reality Model of the Normal Female Pelvic Floor", Annals of Biomedical Engineering, vol. 32, No. 2, Feb. 2004, pp. 292-296.
Hricak, Hedvig; et al., "Vagina: Evaluation with MR Imaging: Part I. Normal Anatomy and Congenital Anomalies", Radiology, vol. 169, No. 1, 1988, pp. 169-174.
Dimond, Robert L.; et al., "New Observations on the Anatomical Features of the Human Vagina and Cervix", Journal of the American Medical Women's Association, vol. 30, No. 8, Aug. 1975, pp. 323-331.
Schuveiller, Michael; et al., "Impacted, Infected Retained Vaginal Tampon in a Patient with Vaginal Duplication: Ultrasound and Magnetic Resonance Imaging Appearance", Journal of Diagnostic Medical Sonography, vol. 8, No. 6, Nov./Dec. 1992, pp. 325-328.
Riederer, S.J., "Current Technical Development of Magnetic Resonance Imaging", Engineering in Medicine and Biology Magazine, vol. 19, No. 5, Sep./Oct. 2000, pp. 34-41.
Suh, Donald D.; et al., "Magnetic Resonance Imaging Anatomy of the Female Genitalia in Premenopausal and Postmenopausal Women", The Journal of Urology, vol. 170, No. 1, 2003, pp. 138-144.
Notice of Reasons for Refusal issued in Japanese Patent Application No. 2011-502002 dated Oct. 30, 2012.
XP-002493869, Use of MRI to determine the in vivo position of a silicone vaginal barrier contraceptive device, E.S. Pretorius et al., Contraception 65 (2002) pp. 343-346.
XP-002523155, MR based 3-dimensional modeling of the normal female pelvic floor with quantification of muscle mass, J.R. Fielding et al., Brigham and Women's Hospital, Harvard Medical School, Boston MA, AJR Am J Roentgenol. Mar. 2000;174(3):657-60.
A biomechanical model of the pelvic cavity: first steps, C. Rubod et al., EMBS Annual International Conference, Aug. 30-Sep. 3, 2006.
International Search Report for PCT/US2008/063015 dated Nov. 20, 2008.
First Office Action against Japanese Patent Application No. 2010-507642 dated Nov. 13, 2012, pp. 1-5.

\* cited by examiner

IMAGE ANALYSIS PROCESSES AND METHODS FOR THE EVALUATION OF TAMPON PERFORMANCE

CROSS REFERENCE TO RELATED APPLICATIONS

This application claims the benefit of Provisional Patent Application Ser. No. 60/928,554, filed May 10, 2007.

TECHNICAL FIELD

The present invention generally relates to processes and methods for the study of feminine hygiene products in vivo and, more particularly, to processes for imaging tampons in the body and methods for evaluating the behavior and effectiveness of such tampons.

BACKGROUND OF THE INVENTION

Magnetic resonance imaging (MRI) is a method of producing graphic images of a three-dimensional object as a result of the excitation and relaxation of certain nuclei in various chemical environments. Nuclei of certain atoms, in particular those having an odd number of protons (charged) and neutrons (uncharged), and usually, more particularly, hydrogen, which has only one proton and no neutrons, are considered to "spin". Spinning of these charged particles, i.e. circulation of the net charged particles, generates a magnetic moment along the axis of spin, so such nuclei act as tiny bar magnets. When an object to be imaged that contains hydrogen nuclei is placed in a powerful magnetic field, the magnetic moment of the protons are aligned in a particular manner with the applied magnetic field, either with (the field (a more stable configuration) or against the external field. Some energy is needed to change this alignment. Just how much energy is required depends on the strength of the field and the frequency of radiation needed to change the alignment. In Nuclear Magnetic Resonance (NMR), the radiation frequency is kept constant and the applied magnetic field is varied until at some point the energy required to change the alignment of the proton matches the energy of the radiation. At this point, absorption occurs and a signal can be observed and measured. The local chemical environment of the nuclei, as well as surrounding nuclei, will change the effective field strength (and hence the actual applied field strength required) to produce this effect. Chemical environments can also change over time, so the resulting NMR spectrum can be changed as well: absorption peaks can change and broaden in response to time scales on how rapidly and how long fields are applied, how much coupling takes place to neighboring protons, and how quickly and how much change takes place in the local chemical environments. Excitation and relaxation spectra can be complicated: T1 (spin-lattice) and T2 (spin-spin) relaxation times are often monitored for different magnetic pulsing sequences, which nowadays are specified in software and control systems. (To image the object in MRI, magnetic gradients are applied, with the magnet focused on a specific part of anatomy. By applying these gradients, spatial positions are encoded within the phase of the signal of the applied magnetic gradients. These spatially-encoded phases (spatial frequencies) are then recorded in a two- or three-dimensional matrix. Images are created from the matrix using Fourier transform methods. Improvements in computational and image analysis techniques, together with developments in Nuclear Magnetic Resonance (NMR) technology (e.g. magnetic pulsing and echoing techniques) have driven the rapid development of MRI.

The MRI technique is safe, non-invasive, and generally preferred by patients over other imaging techniques because the patients can usually lie down comfortably and remain fully clothed. Physicians prefer MRI over other imaging techniques like ultrasound and X-rays, because there is no ionizing radiation with MRI and because these latter techniques, while valuable, provide less geometric detail and less specificity than MRI. Magnetic field strengths are too low to cause significant health or safety problems. In fact, MRI is becoming less expensive, more accurate, more precise, and easier to interpret. New MRI systems continue to develop at a rapid pace and are widely available in hospitals, medical schools, doctor's offices, and even rural medical clinics.

In general, MRI has been used to diagnose a wide variety of internal disease states. Because the image responds mainly to the nuclear spin states associated with hydrogen nuclei in water and surrounding (and possibly changing) local chemical environments, it can provide information concerning fluids that various anatomical structures contain. By changing MRI pulsing and echoing parameters, a change in grey scale can be produced, to allow one anatomical feature with one chemical environment to be easily distinguished from another. MRI can provide physicians with views of internal organs, bone structure, muscle tone, fluid, and the relative sizes and shapes of products of disease states such as tumors, cysts, clots, and so on.

Pelvic anatomy in both male and female subjects has been studied using MRI techniques. Detailed pictures have been published to provide physicians and other medical practitioners with information and sketches related to key anatomical structures in the pelvic region. Owing to the amount of fluid (urine) present, the bladder is especially easy to see by MRI, typically appearing as white or black in a grey scale image. Other tissues and organs are less easily seen: experts are often needed to interpret complicated anatomical MRI images. One object that can be readily identified when present in a woman's pelvic region using MRI is a tampon. Current methods of using MRI to study tampons in vivo, however, lack precise detailed methods and processes for obtaining realistic measurements of female anatomy and tampons and for assessing performance of the tampons with respect to the female anatomy.

Based on the foregoing, it is an object of the present invention to provide a method for using MRI to study the behavior of tampons in vivo, the resulting images being analyzed to assess tampon functionality in a woman's body.

SUMMARY OF THE INVENTION

In one aspect, the present invention resides in a method for the study and evaluation of the performance of medical devices in vivo. The medical devices are preferably tampons that are observed and evaluated in the vaginal cavities of women during their menstrual cycles in order to obtain data relative to tampon performance for the improvement of tampon technology. The method preferably uses proton magnetic resonance imaging (MRI), although other types of imaging techniques may be used; e.g. electron spin resonance imaging or magnetic resonance imaging using nuclei such as Carbon-13, Fluorine-19 or Phosphorus-31. In the method, a database populated with information relevant to the method is established, and one or more candidates are qualified for participation in a study employing the above-described method.

The qualification of the candidates as participants in the study and evaluation involves subjecting the candidates to an evaluation process that at least determines the ability of the candidates to safely participate in the study. Consent is also obtained from the candidates regarding tests conducted during the study. Once a candidate has been cleared for participation as a participant in the study, information relevant to the candidate and the qualification thereof is entered into the database.

Details pertaining to the particular MRI protocols and parameter settings relevant to the candidates are determined. These details typically include plans for each imaging scan, such plans including, but not being limited to, the determination of parameter settings for echo sequences, plane geometries for each scan, and numbers of scans. Once these protocols and parameters are determined, the scans of each candidate are conducted using an MRI operable in accordance the protocols and parameters.

The resulting MRI scans are then analyzed qualitatively and quantitatively using suitable software programs. Finally, the database is populated with information indicative of the analyses made. These scans can be made over a period of time to allow for evaluations of tampon behavior.

In another aspect, the present invention resides in a method of MRI analysis in which a three-dimensional surface model image of a medical device such as a tampon or similar feminine hygiene product in vivo is created from two or more two-dimensional cross section images and combined with a second surface model image to produce a single image. In this method, the second surface model image is at least one medical device in vivo and an anatomical structure proximate the medical device. Thus, individual scans of a medical device (such as a tampon) can be combined or "segmented" with a scan of an anatomical structure to provide an image or model of the medical device or the anatomy for further study.

One advantage of the present invention is that realistic and accurate measurements can be obtained using above-described image analyses to assess the behavior and performance of tampons in a woman's body. Accordingly, an improved understanding of how tampons affect a woman's body can be gained. More specifically, the methods and processes of the present invention provide insights regarding the location of tampons in the vagina and their movement over time in response to normal activity; expansion characteristics; problems related to leakage; how variations in anatomy affect tampon location, movement, and performance; how different tampons behave in body; and how to improve the design of tampons to correct the problems of prior art tampons.

DETAILED DESCRIPTION OF THE INVENTION

The present invention involves image analysis processes and methods for the study and evaluation of the performances of medical devices. As used herein, the term "medical devices" includes, but is not limited to, tampons and related feminine hygiene products and the like. Although the disclosure herein refers to "tampons," it should be understood that the present invention is not limited in this regard. The image analysis processes utilize magnetic resonance imaging (MRI) techniques. The present invention is also not limited in this regard, however, as other processes and methods for image analysis are within the scope of the present invention.

Figure 1:
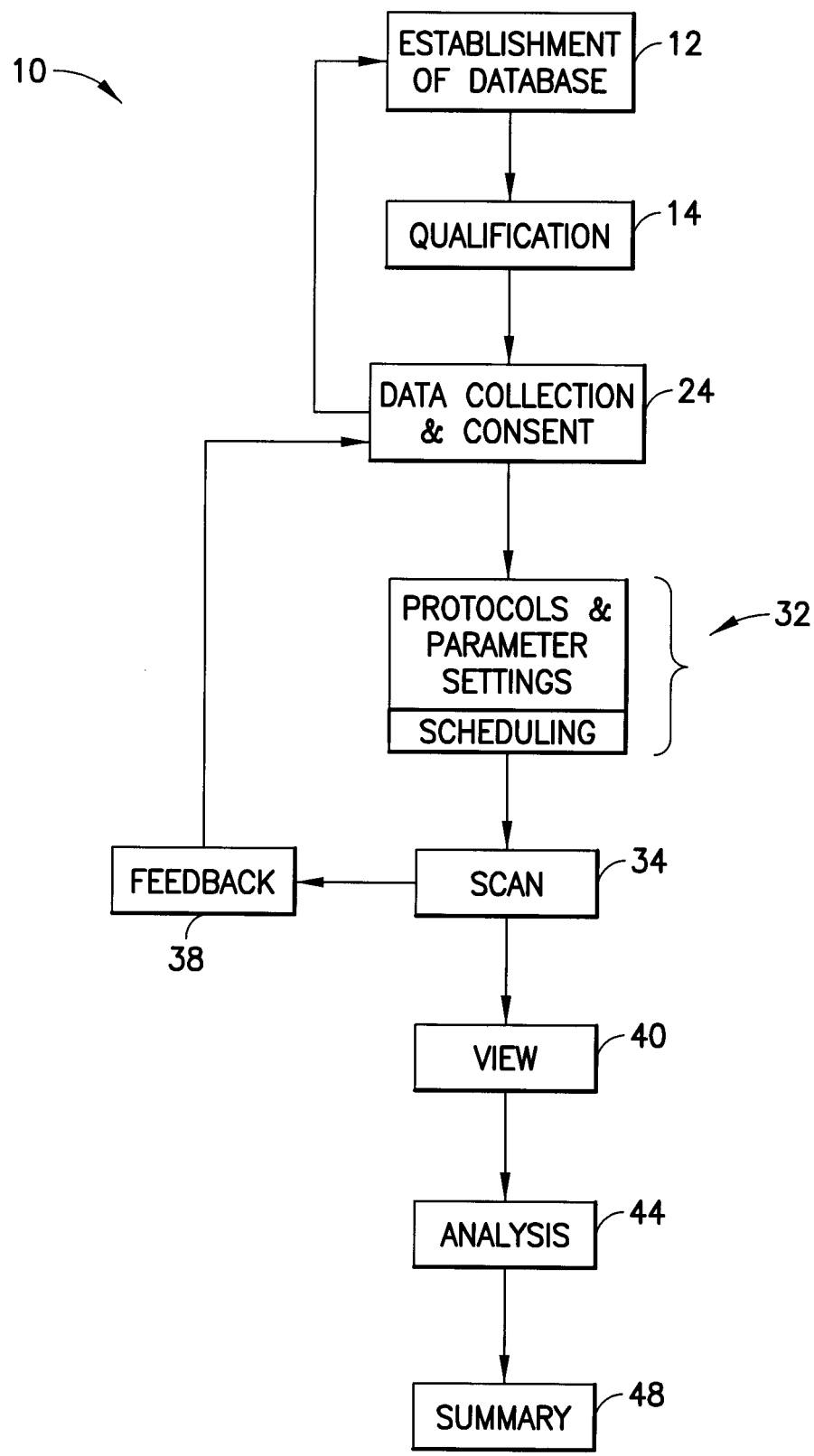
FIG. 1 is schematic representation of an image analysis process and method of study and evaluation of tampon performance, of the present invention.

The processes and methods described herein comprise various administrative, technical, and analytical steps. Referring to FIG. 1, a flowchart illustrating the various steps is shown generally at 10 and is hereinafter referred to as "process 10." The administrative aspect of the process 10 is initiated by the establishment of a database 12 that is populable with information relevant to the study and evaluation of the performance of the tampons analyzed. In order to conduct a study involving the behavior and effects of tampons when positioned in a woman's body, suitable candidates for the study are provided. A qualification step 14 is performed in which a candidate is assessed for suitability for participation in the in vivo testing processes and methods disclosed herein.

Figure 2:
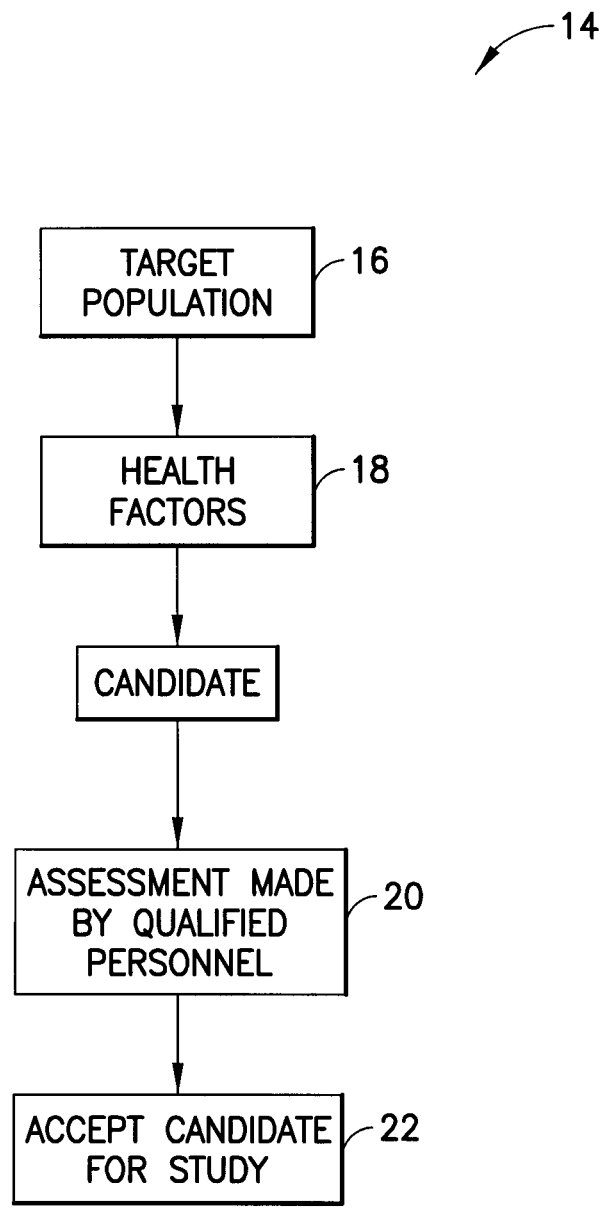
FIG. 2 is a schematic representation of a qualification step of the image analysis process and method of study and evaluation of tampon performance of FIG. 1.

As shown in FIG. 2, in the qualification step 14, the candidate is selected from a target population 16 and assessed in terms of her health as to whether or not she should participate in the test. The selection of the candidate from the target population 16 may be performed by active recruitment of candidates, or it may be performed by making a blanket request for women to take part in the study. Still further, the women may be referred by their physicians or other health care providers. An assessment of various health factors 18 is made. These various health factors 18 relate to such things as pregnancy, a compromised immune system, a blood disorder, or the like. A determination of the health factors 18 as well as the overall desirability of the candidate for testing is made in an assessment step 20. In the assessment step 20, particular factors may disqualify the woman from participating in the testing process. On the other hand, a particular factor may qualify the woman for participation in the testing process. The candidate is then accepted in an acceptance step 22.

Figure 3:
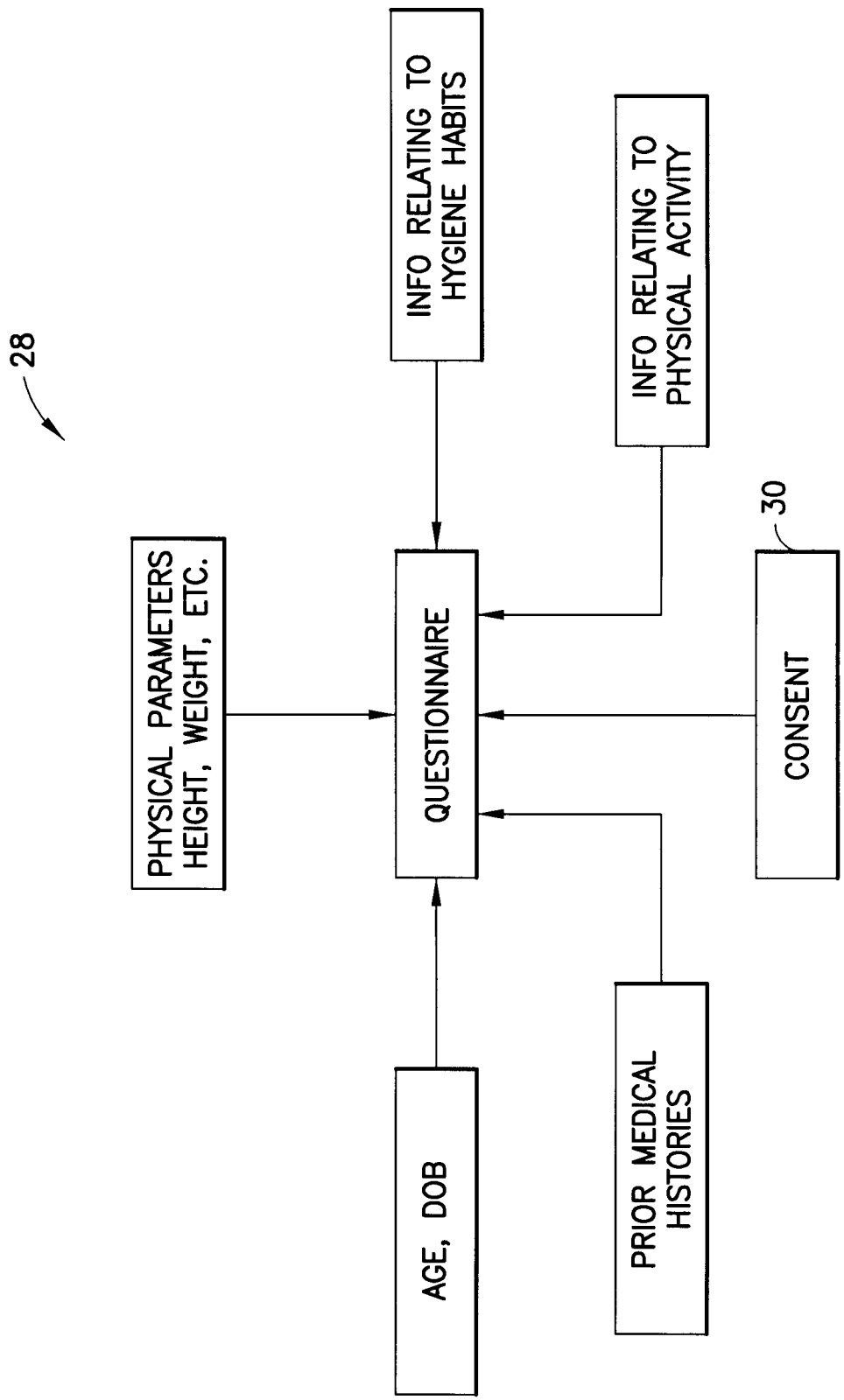
FIG. 3 is a schematic representation of a questionnaire used to obtain information from a test participant.

Referring back to FIG. 1, following the qualification step 12, a data collection and consent step 24 is performed. In the data collection and consent step 24, information is provided by the participant. Compensation for the participant's participation in the process 10 may be agreed upon, and the participant may or may not agree to being videotaped during testing. Referring to FIG. 3, the participant provides personal information, hygiene habits and practices, and the like via an inquiry 28, which may be a questionnaire. This information is collected to facilitate the generation of meaningful statistical correlations of hygiene habits and practices to tampon performance and entered into the database. In addition to information such as age, race, height and weight, current state of well-being, number of children delivered, and the like, information relating to typical feminine hygiene devices normally used (such as brands and sizes), histories of gynecological illnesses or abnormalities, birth control histories, characterizations of typical menstrual flows, and whether the participant is right-handed or left-handed can be collected. Consent can be given by the participant in a consent step 30. Data indicative of the particular tampon (and any other feminine hygiene product) that will be used during the testing procedure is recorded.

Referring back to FIG. 1, detailed study protocols relevant to each candidate are ascertained in step 32. A general scheme for testing is outlined, which leads to specific parameter settings for the particular instrumentation used. The specific parameter settings including the sequencing of the imaging scans to cover the appropriate anatomical features in all three orthogonal planes, timing of the scans, pulse times, spin echo parameters, and the like are then programmed into the database 12. These parameter settings may be entered into the database 12 by a trained technician under the supervision of the qualified personnel. Step 32 may also include the scheduling of the testing. In an embodiment of the present invention, each participant is scheduled for MRI scanning three times during her menstrual cycle, each time with a different tampon. A typical study involves a sufficient number of participants to ensure that an adequate range of things such as, but not limited to, ages, heights, weights, habits, and practices are covered in the study.

A scan step 34 is then performed. In the scan step 34, an MRI apparatus operable in accordance with the general study protocols and parameters defined in step 32 is used to obtain scanned images. The scanned images are taken using any suitable MRI apparatus (e.g., the Yale Siemens Sonata MR 2004A (1.5 Tesla)). The actual imaging scans are generated automatically from the MRI apparatus using suitable data acquisition and control systems. The protocols as indicated above are translated into machine code to control the magnets forming part of the MRI (or other mechanisms involved) to generate outputs of grey scale images. The information database is managed according to the large number of imaging scans made in a sampling of data.

In a typical MRI test, each imaging scan includes a localizer gradient echo sequence followed by three orthogonal planes of fast spin echo T2-weighted scans through the tampon positioned in the participant. The orthogonal planes are characterized by sagittal, coronal, and transaxial planes. Several axial T1-weighted imaging scans should also be conducted. The signal behavior, expansion, and position of the tampon relative to the external outer surface of the cervix of the participant are recorded. Each imaging session is conducted a number of times (e.g., three separate times) to allow different types of tampons to be viewed in vivo per menstrual cycle. Typically, a total of at least about 100 scans are taken per imaging session.

After the scan step 34, feedback from the participant is provided in a feedback step 38. In the feedback step 38, the data portion of the data collection and consent step 24 is supplemented. More specifically, data that is relevant at the conclusion of imaging in the scan step 34 is collected. This data includes, but is not limited to, information relative to comfort and/or pain experienced during the scan step 34, insertion of the tampon (if not previously described), and the like. The present invention is not limited with regard to the foregoing data, however, and other inquiries may be made and answers provided by the participant. All data collected may be used to update the database 12.

After the scan step 34, the imaging scans generated can be in the form of films that can be viewed in a viewing step 40 using a light box. These films may then be scanned using a computer scanning device or otherwise transferred into a computer or appropriate electronic files in standard graphics formats. Such formats include, but are not limited to, JPEG, bitmap, and TIFF formats. When scanned or transferred into an electronic file, the scanned images may include at least some of the protocol information on the file as text or graphics in the margins, headers, and/or footers of the scanned image. While the generation of film has been described, the present invention is not limited in this regard, as the images can be uploaded directly to a computer for viewing on a screen forming part thereof.

In addition to being produced in film and in electronic format, the generated imaging scans can be provided in formats that are currently standard in the medical field. One such format is DICOM (the Digital Imaging and Communications in Medicine standard) which was created by the National Electrical Manufacturers Association (NEMA) to aid the distribution and viewing of radiologic images from, for example, CT (computed tomography) scans, MRI, and ultrasound. This format allows standard software packages, which are often available as freeware Internet downloads, to be used to perform an analysis of images.

One such standard software package is ANALYZE, which is available from AnalyzeDirect of Lenexa, Kans. AnalyzeDirect is a licensed by the Mayo Clinic to distribute the software. The ANALYZE software package is supportable on most modern workstation platforms and most personal computer systems. The ANALYZE software package provides direct and automatic user transparent support for reading the DICOM format. It is also capable of importing data of unknown format to enable users to generate their own format readers. The ANALYZE software package also provides support for writing common CAD (computer aided drafting) formats.

Another software package useful for viewing the imaging scans in the DICOM format is ezDICOM, which is a freeware program that operates on a Windows® platform. Yet another software package useful for image analysis and for transfer of DICOM images is SIMPLE DICOM, available as freeware from the University of Pittsburgh Medical Center (Pittsburgh, Pa.). Another software package that can be used is MRIcro, which is also available as freeware for Windows® and Linux platforms. The MRIcro software package is able to view images from DICOM as well as ANALYZE. It can also be used with ECAT, Genesis, Interfile, Magnetom, Somatom, and NEMA images for conversion to ANALYZE format. By using SIMPLE DICOM, ezDICOM or MRIcro, the MRI images taken with regard to the processes and methods of the present invention can be rapidly scanned or exported from one computer system to another. The images obtained may, in some embodiments, also be colorizable.

Figure 4:
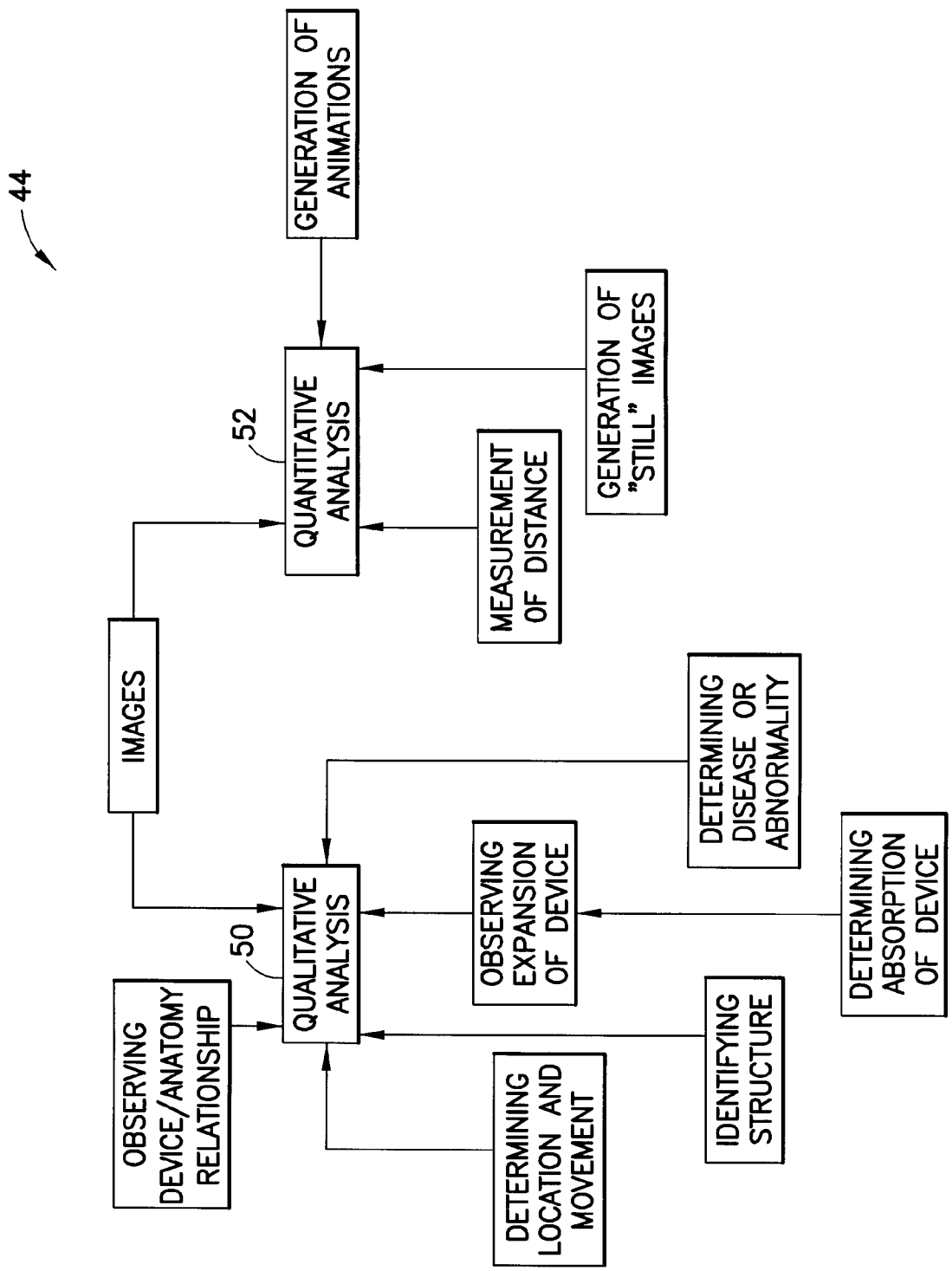
FIG. 4 is a schematic representation of an analysis step of the image analysis process and method of study and evaluation of tampon performance of FIG. 1.

With regard to the imaging scans generated, both qualitative and quantitative analyses are performed as part of the overall process 10 in an analysis step 44. Referring now to FIG. 4, the analysis step 44 includes both qualitative image analysis 50 and quantitative image analysis 52. Qualitative image analysis can include (1) identifying general anatomical structures in the areas proximate the tampon when the tampon is inserted into the participant; (2) observing how the tampon expands over time; (3) observing how the presence of the tampon influences the vaginal shape (or how the vaginal shape influences the tampon); (4) determining where the tampon is likely to be found inside the vagina; (5) determining where and how the tampon moves inside the vagina over time; (6) determining how specific disease states (e.g., the presence of ovarian cysts, fibroids, and the like) influence tampon performance; and (7) determining whether or not fluid absorption is indicated or not. Determinations relating to fluid absorption may be ascertained relative to the expansion of the tampon. Other factors may also be considered in the qualitative image analysis.

By viewing the tampon in the above-described orthogonal planes and with both T1 and T2 images, insights concerning these qualitative features can be determined. For example, cross-sectional tampon shapes can usually easily be determined by viewing transaxial T1 images. In particular, it can be determined whether a tampon is generally oval-shaped or circular in cross-section. Height of the tampon in the body can usually be determined by comparing sagittal plane images, while coronal images are useful to see orientation in body. For example, a coronal image can be used to indicate whether a tampon bends in vivo to conform to the vaginal shape.

Gradations of color or grey scale in a generated imaging scan of a tampon provide some idea of how much or how little menses has been absorbed. If the porous portion of a tampon is mainly air, the scan will be very dark (for a T1 scan) or very light (for a T2 scan). If the tampon is saturated with menses, the scan will be very light for a T1 scan or very dark for a T2 scan. However, a small amount of absorption of the menses with regard to either scan will indicate pockets of alternating light and dark color on the imaging scan generated, which often causes the image of the tampon to blend into the background.

With regard to quantitative image analysis 52, both "still" pictures and three-dimensional "animations" can be generated to show various perspectives of tampons, vaginal cavities, and other anatomical structures in relationship to one another and how these change from different observational viewpoints.

Image analysis software can be used together with MRI images to measure physical dimensions such as volumes, surface areas, distances, etc. By computing these quantities, the expansion or swelling of a tampon in vivo can be quantitatively determined.

Figure 6:
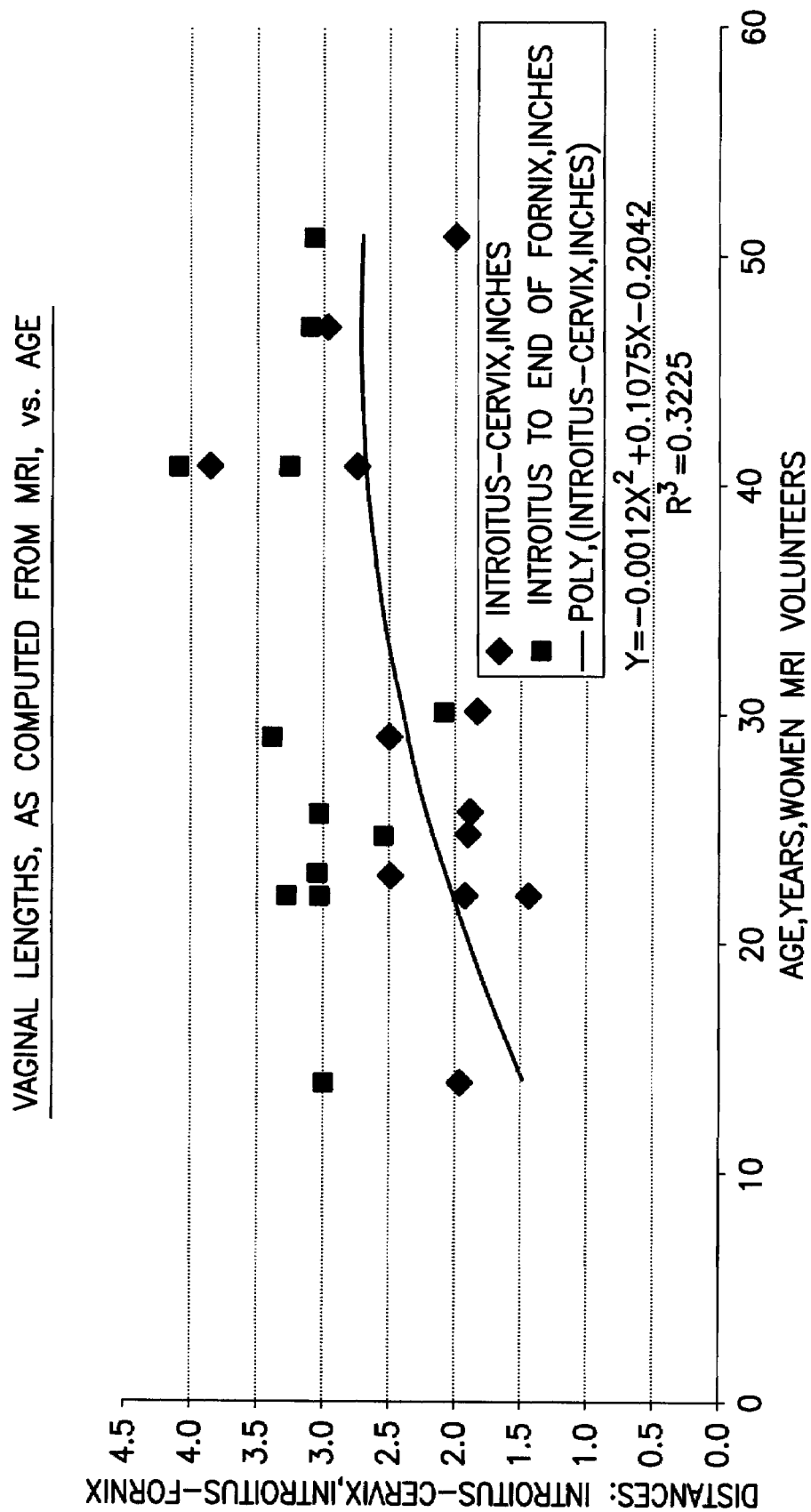
FIG. 6 is a graphical representation of a determination of vaginal lengths computed from MRI scans.

In particular, the generated imaging scans can be used to determine vaginal lengths. Referring now to FIG. 6, vaginal distances appear to increase with age, and then level off or decrease slightly as women get older. Average distances are 2.29 inches (to cervix) and 3.07 inches (to formix), with a significant amount of variability. The short distances may suggest why it is more comfortable to insert the tampon beside the cervix instead of in line with it.

In addition to providing "still" images, the scans can be compiled to generate three-dimensional animations or graphics that show various perspectives of tampons, vaginal cavities, and other anatomical structures in relation to one another. These animations or graphics can also be used to views and/or changes from various observational vantage points.

To perform quantitative image analysis 52, other software packages may be useful in analyzing the generated imaging scans. In particular, a software package known as 3D-DOCTOR, available from Able Software (Billerica, Mass.), can be used to provide image analysis. The 3D-DOCTOR software provides advanced three-dimensional modeling, image processing, and dimensional analysis for various imaging applications including, but not limited to, MRI, CT, PET, microscopy, scientific, and industrial three-dimensional imaging. The 3D-DOCTOR supports both grey scale and color images stored in DICOM and other image file formats and can create surface model images and volume renderings from two or more two-dimensional cross section images taken in real time on a computer having adequate graphics functions. By simple tracing, specific anatomical features—or medical devices like tampons—can be "segmented" to be viewed separately, without the "clutter" of surrounding images. Typically, this is done using several related two-dimensional scans to produce a three-dimensional image of an individual anatomical part or medical device. In turn, the individual images, once segmented and combined into three-dimensional images, can then be combined with other such images to produce a single image and viewed in combination in either two or three dimensions. That is, each individual image can be viewed individually or in combination with other images.

Besides 3D-DOCTOR, which is largely a software system, there are also systems comprised of both hardware and software that are useful in image analysis and graphical presentations of medical images, in particular MRI images. The AW Advantage Workstation (GE Healthcare, Milwaukee, Wis.) is one such system. This system allows DICOM-based images that can be displayed in excellent quality 2D and 3D images. Images can be transferred from MRI machines directly or from Windows-based workstations to the GE AW Advantage workstation. This workstation (a sort of computer "appliance") allows for image segmentation, side-by-side comparison of images, computation of key quantitative information, and other, advanced means of comparing images having specific attributes specified in the database structure it provides.

Moreover, the software and hardware/software systems such as those described above can be used to export the surface model images to at least one of STL (ASCII and Binary), DXF, IGES, 3DS, OBJ, VRML, PLY, XYZ and other computer readable formats for surgical planning, simulation, quantitative analysis and rapid prototyping applications (which may be particularly useful for generating models of tampons or other medical devices or the environments in which they are used for further study). Furthermore, using 3D-DOCTOR and software embedded in the GE AW Advantage Workstation system, measurements (e.g., volume, distance, surface area, and the like) can be made for quantitative analysis. This enables, for example, the extent to which a tampon has expanded or moved inside the body over time to be measured.

The quantitative information from systems like 3D-DOCTOR and the GE AW Advantage Workstation can also be communicated to other software packages, such as Microsoft Excel, Statistica (StatSoft, Tulsa, Okla.) and other graphics and statistics packages (e.g. SAS, SAS Institute, Cary, N.C.), in order to compare results for various women and various tampons. Such data analysis packages also allow key anatomical features to be recombined with key tampon features and questionnaire results for improved visualization and valid statistical comparisons. One can then use such statistical comparisons and graphics to compare tampons and other medical devices as well as to guide product development of new devices, such as new, improved tampons.

Figure 5:
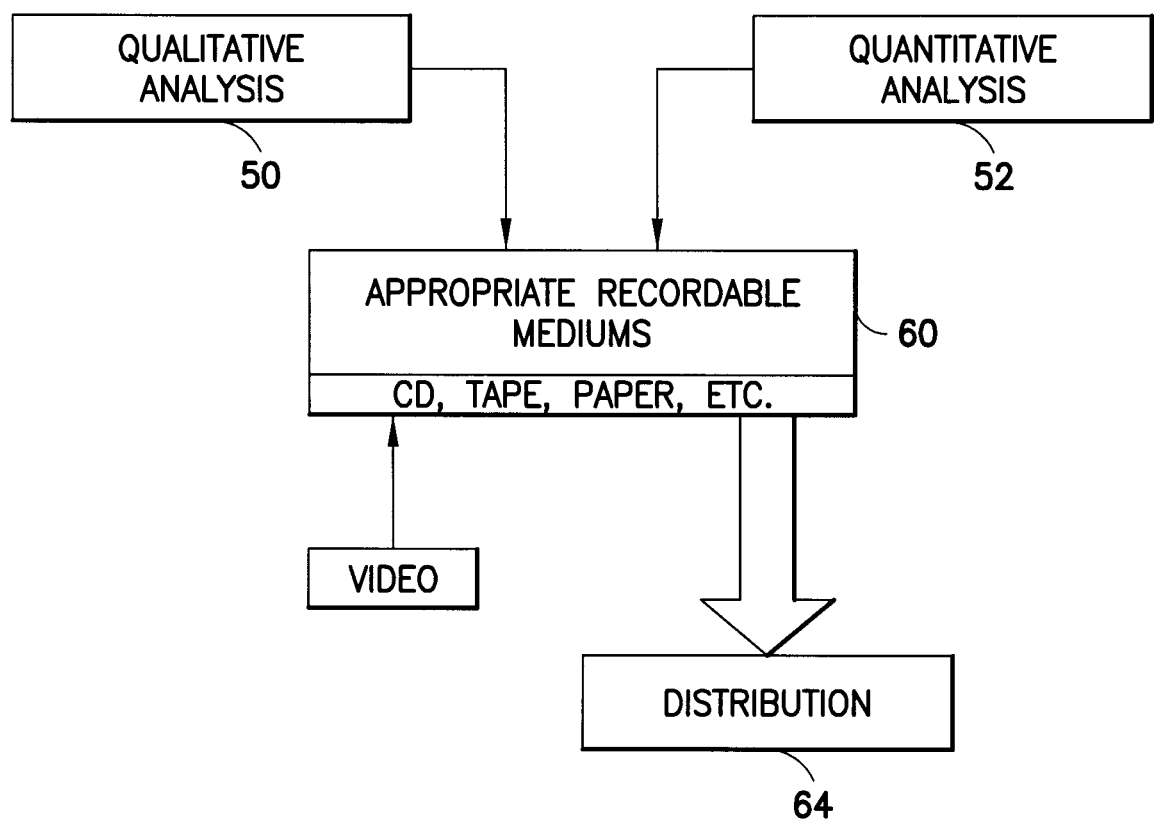
FIG. 5 is a schematic representation of a summary step of the image analysis process and method of study and evaluation of tampon performance of FIG. 1.

Referring back to FIG. 1, subsequent to the viewing step 40, a summary step 48 is executed. In the summary step 48, information derived from the qualitative image analysis and quantitative image analysis is collected, compiled, and (if necessary) distributed. Referring now to FIG. 5, the summary step 48 includes the step 60 of writing information from the qualitative image analysis 50 and the quantitative image analysis 52 to appropriate electronic mediums as well as paper mediums. Any videotaped records of the participants may also be included in the step 60 of writing information to the appropriate mediums. Given the oftentimes large number of images obtained (due to the fact that, typically, 10-20 women are often used in a study), the collection and compilation of the data should be carefully managed, particularly to ensure the privacy of each participant.

The appropriate mediums are then distributed to the necessary personnel in a distribution step 64. Once distributed, the information compiled is used to generate ideas for further study and research and development. More particularly, the information is used for new product development. Information derived may include, for example, the key role of tampon placement in terms of improving leakage protection (and not compromising comfort).

Other information derived may concern the fact that many women have experienced a variety of "disease states," some of which have been uncovered in the MRI scanning studies. More specifically, it has been determined that about 70% have had (or are having) some sort of OB/GYN problem. Table 1 provides some exemplary disease states that can be reported by test participates or are discoverable during testing.

TABLE 1

| Disease State | Number of Women |
|---|---|
| Ovarian cysts | 2 |
| Adenomyosis | 1 |
| Menstrual cramps | 1 |
| Uterine fibroids with a uterine septum (myometrium extends to the internal cervical os | 1 |
| Cervical cysts, endometrial meiosis, uterine fibroids, a large urethra (likely has stress incontinence) and gas problems | 1 |
| Yeast infections | 5 |

Other information that may be derived concerns tampon expansion. In particular, tampons tested in the processes and methods of the present invention appear different than the tampons observed in standard FDA syngyna tests and that expansion is much less than observed in those tests. Expansion is typically only about 40%, which amounts to a few cubic centimeters over the total volume of the tampon tested. Also, the initial cross-sectional shapes of the tampons can be circles or ellipses, but the direction of expansion does not necessarily correspond to the original cross-sectional shape.

Example 1

Tampon Analysis Study Protocols and Test Parameter Settings

A number of commercially available, non-deodorant tampons are scheduled for study using MRI. Testing is performed on eight different participants, namely, three different teenagers (ages 13-20); two multiparous women (any age, provided that they have had at least two children); and three perimenopausal women (ages 42-52). The women who volunteer to be participants should be tampon or tampon/pad users. Each participant will be scanned three different times, using three different tampons.

An inquiry is made to collect information regarding age, race, height, weight, right- or left-handedness, feminine hygiene product preferences (and any other information deemed relevant) for each of the eight participants. Information indicative of the tampon product to be tested (e.g., absorbency grade, size, and the like) for each participant is recorded. Each participant preferably utilizes the tampon product that she normally uses.

A gel containing a safe contrast agent may be added to the vagina of one or more participants.

Each participant may be videotaped during the testing procedure. Appropriate consent and confidentiality agreements are made.

Testing is performed by taking measurements using MRI during the menstrual cycle of each participant, preferably on the second day of each menstrual cycle. The second day is preferred because it is usually the day with the highest flow. Each measurement is made at three intervals, namely, prior to insertion; immediately after insertion; and four hours after insertion just prior to removal. The exact time of removal is recorded. During the four-hour period after the second scan is made immediately after insertion and the removal of the tampon, the participant should resume her normal activity to the extent possible.

The MRI measurements are taken using a protocol to provide a sufficient number of sagittal images (about 25 T1 and 25 T2 images), transaxial images (about 15 T1 and 15 T2 images), and coronal images (about 15 T1 and 15 T2 images). The images should be made in 2 millimeter (mm) increments for the sagittal images and about 4 mm for the others. About 110 images should be made total in an effort to provide sufficient detail and resolution to get the needed quantitative data. A 2-4 mm increment is a reasonable compromise for the time required to balance the resolution needed. Each set of the 110 images (approximate) should be repeated all three times.

The images are recorded in the DICOM format and read using the ANALYZE and eZDICOM software packages.

The used tampon of at least one participant should be discarded as potentially biohazardous material. Consent from the participant should be obtained (if necessary).

Example 2

Determination of Position of Tampon in Body

Figure 7:
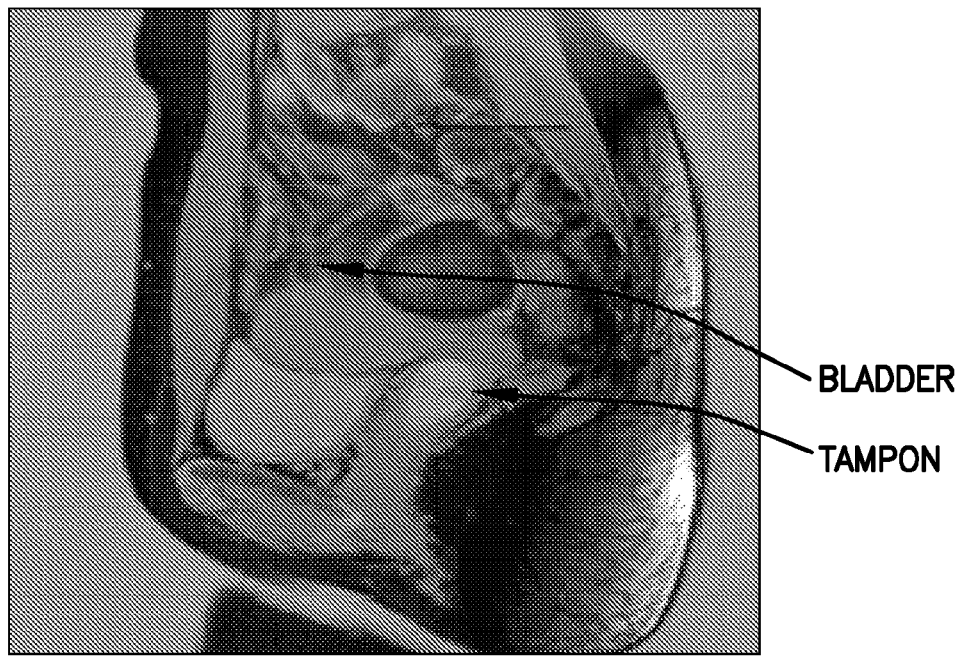
FIG. 7 is a sagittal plane image MRI scan of a tampon in a vaginal cavity.
Figure 8:
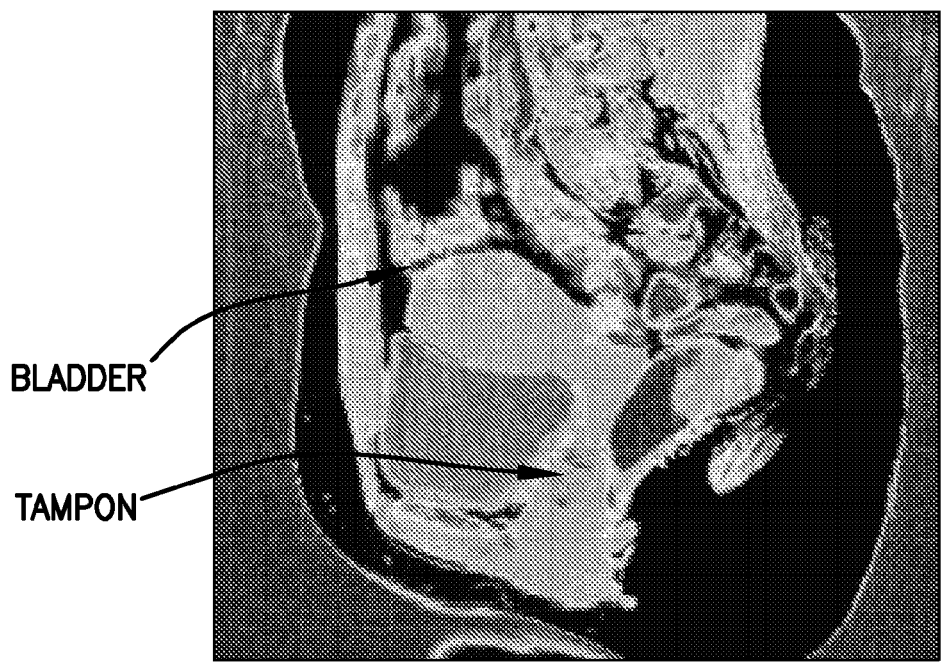
FIG. 8 is a sagittal plane image MRI scan of a tampon in a vaginal cavity.

Referring now to FIGS. 7 and 8, the height of a tampon in the body of the participant was determined using sagittal plane images. The images are sagittal scans taken of two different women. Both women were in their early 20's. The images suggest that tampon placement in the body can vary from woman to woman. Variation in tampon placement can contribute to variations in the absorption of menses.

As can be seen in FIG. 8, absorption of the menses indicates pockets of alternating light and dark color on the image, which often causes the image of the tampon to blend into the background.

Figure 9:
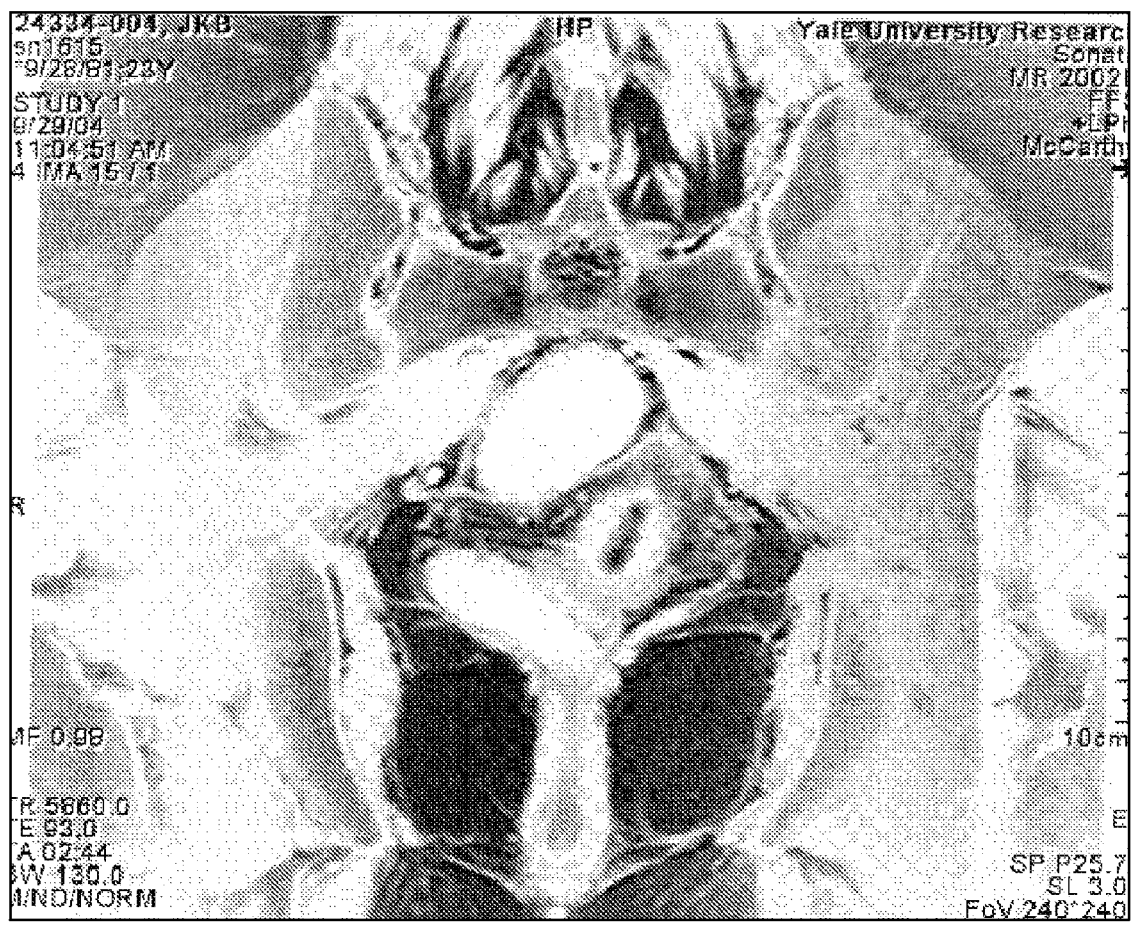
FIG. 9 is a coronal plane image MRI scan of a tampon in a vaginal cavity.

Referring now to FIG. 9, a coronal image illustrates the orientation of the tampon in the body of the test participant.

Figure 10:
FIG. 10 is a coronal plane image MRI scan of a tampon in a vaginal cavity.

Referring now to FIG. 10, a coronal scan of a tampon (in this case a commercially available TAMPAX ORIGINALS tampon) is shown to bend in the body of the participant to conform to the vaginal shape.

Example 3

Segmenting of the Vaginal Cavity Using Software

Figure 11:
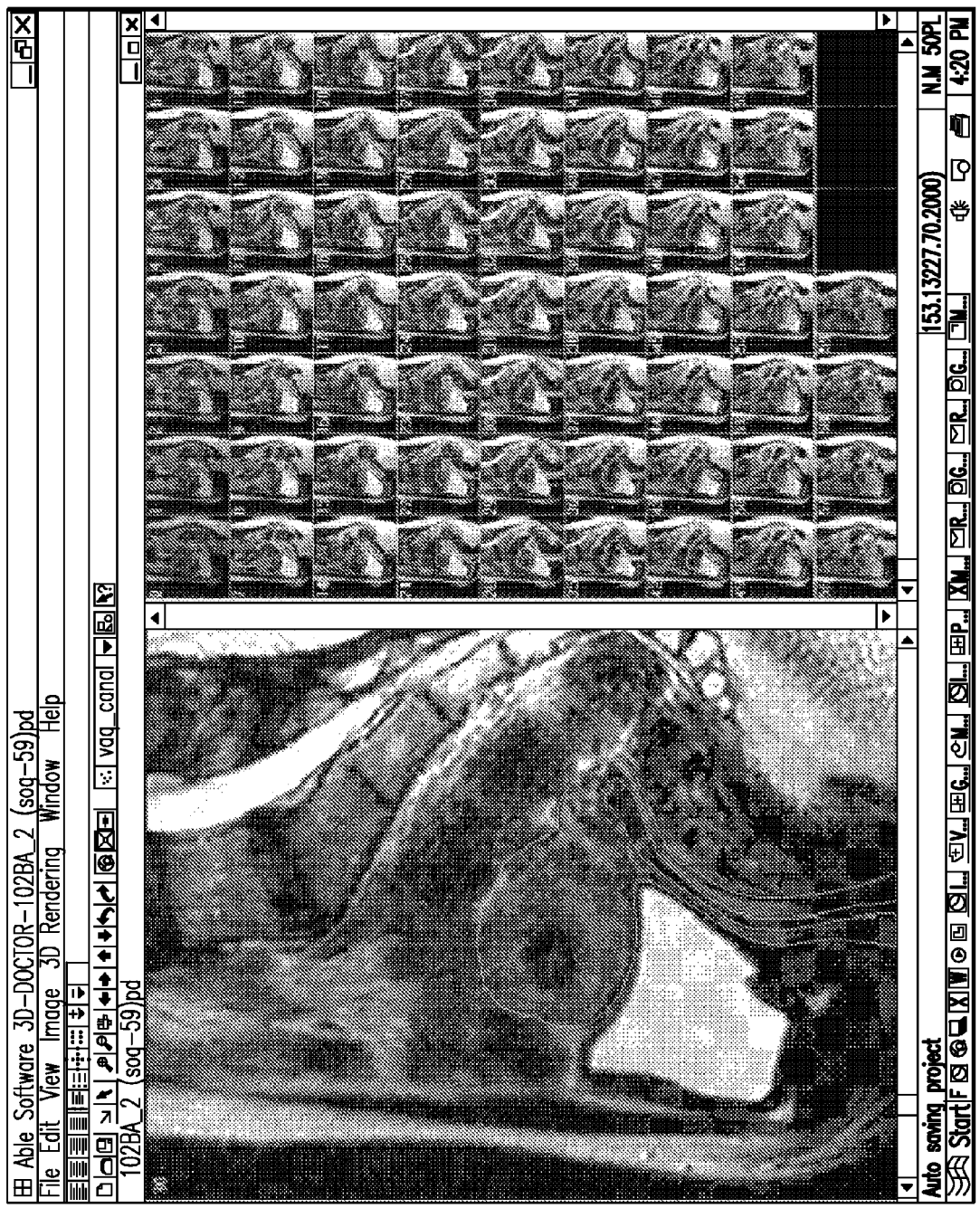
FIG. 11 is a screen print of the 3D-DOCTOR software program.

The 3D-DOCTOR software program (a screen print is shown in FIG. 11) utilizes tracing to allow for the segmenting of the vaginal cavity and uterus of a participant via scans made prior to the insertion of the tampon into the vagina. Segmenting allows for the generation of an accurate CAD file for the creation of a three-dimensional modeled vagina that illustrates the correct anatomy.

Figure 12:
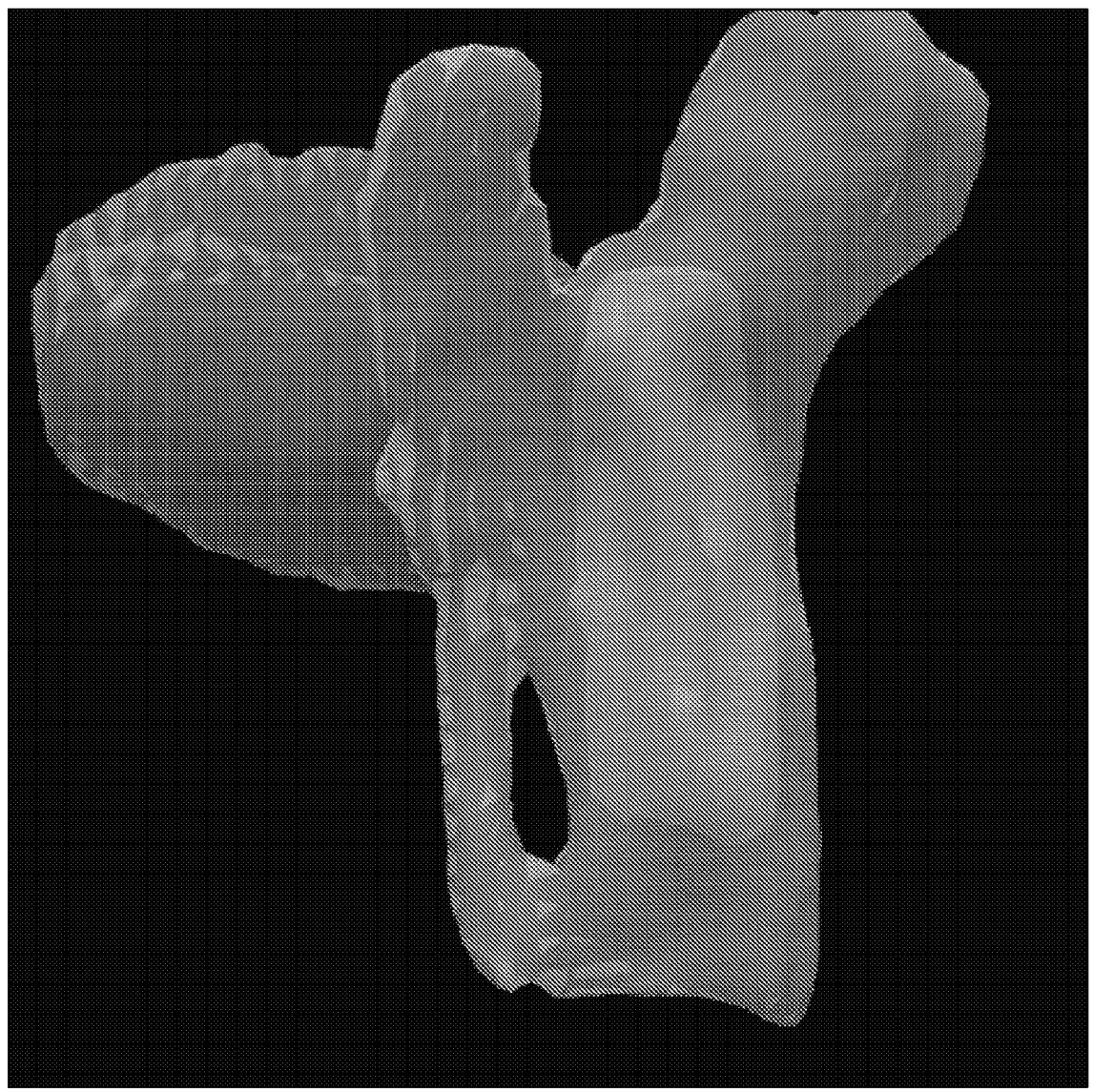
FIG. 12 is an image of segmented pictures of a tampon in a vaginal cavity.

Referring now to FIG. 12, a three-dimensional profile includes separately segmented pictures of a tampon and vagina of a 30-year old participant taken four hours after insertion of the tampon into the vagina. The tampon (in this case a commercially available O.B. SUPER tampon) and was placed slightly on the left side of the vagina and a short distance up in the vaginal formix. Also shown in the segmented pictures is the participant's bladder.

Figure 13:
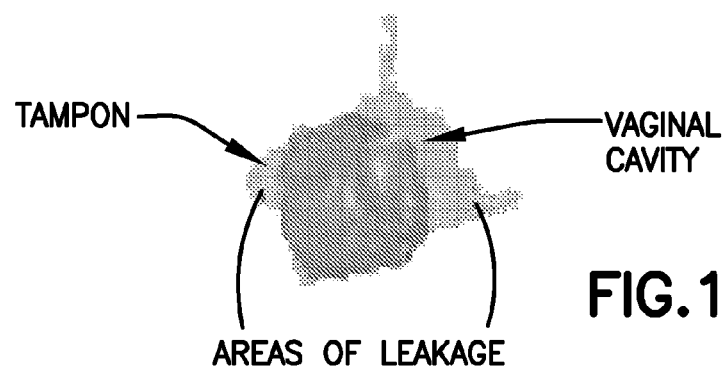
FIG. 13 is a segmented image of a top view of a tampon in a vaginal cavity.
Figure 14:
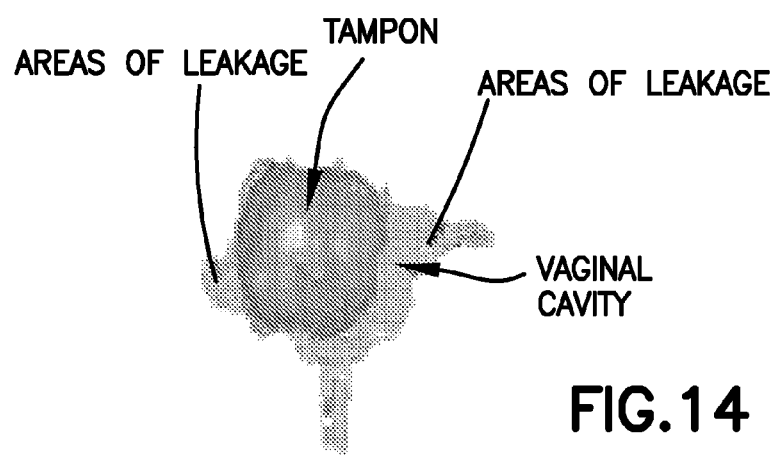
FIG. 14 is a segmented image of a bottom view of the tampon in the vaginal cavity of FIG. 13.
Figure 15:
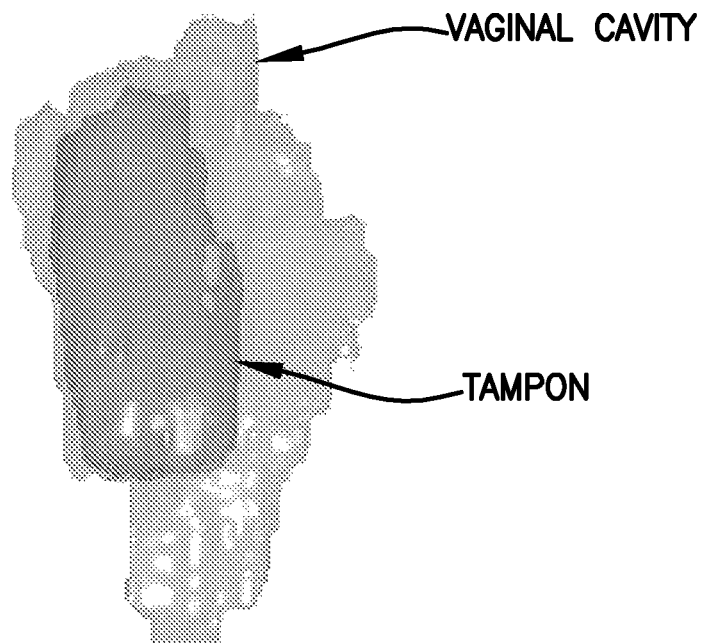
FIG. 15 is a segmented image of a side view of the tampon in the vaginal cavity of FIG. 13.

Referring now to FIGS. 13-15, views of a tampon (in this case a commercially available BEYOND tampon) and vagina of a 29-year old participant are shown. The images shown are segmented. Different perspectives are used to show that the tampon is up high in the right vaginal formix and that there are clear channels for which bypass leakage could take place. More specifically, these views suggest that the tampon does not take up all the empty space in the vaginal cavity and that fluid could potentially run down the tampon and out of the participant's body rather than being absorbed. The views also suggest that placement here would be better if the tampon were lower in the vagina, since the vaginal cavity is narrower near its bottom portion (near the introitus) than near its topmost portion closer to the cervix or neck of the uterus.

Example 4

Generation of Three-Dimensional Vaginal Cavity Mold

The CAD file is converted into a three-dimensional mold design using suitable software (e.g., PRO-ENGINEER, SOLID WORKS, or the like). The CAD file is used in the design of a vaginal cavity mold for use in further laboratory studies. Rapid prototyping, which is the automatic construction of physical objects using solid freeform fabrication by taking virtual designs from CAD files or animation modeling software, may be used to produce the vaginal cavity mold and/or a tampon for use with the mold.

Referring back to FIG. 11, the tracing using the 3D-DOCTOR software is shown as illustrating the procedure for providing the outline of the vaginal mold.

Figure 16:
FIG. 16 is an image of a mold of a vagina generated from a CAD file.

Referring now to FIG. 16, a partial picture of the mold generated from the CAD file from the segmentation and tracing performed using the 3D-DOCTOR software program is shown. The vagina generated from the mold is somewhat flat, larger and wider in the side-to-side direction near the top (proximate the uterus), and smaller and narrower near the bottom (at the vaginal introitus).

The CAD files are also used to generate meshes for accurate finite element analysis computer calculations of tampon performance.

Example 5

Dimensional Analysis Using 3D-Doctor

Table 2 below provides a summary of some dimensional data for tampon usage in two different participants. Both participants were viewed initially and after four hours. An increase of about 2 to 3 cubic centimeters in tampon volume for both tampons, indicative of some absorption by both tampons, is shown.

TABLE 2

| Study | Age of test subject | Time after insertion (hrs.) | Plane | Tampon | Volume (cc) | Area (sq. cm) | Centroid (center of mass cords of tampon), mm | | |
|---|---|---|---|---|---|---|---|---|---|
| | | | | | | | x | y | z |
| 1 | 17 | 0 | Transaxial | Pearl Regular | 3.42 | 15.13 | −5.60 | −5.21 | −34.18 |
| " | " | 4 | " | Pearl Regular | 6.09 | 23.03 | −8.42 | −0.15 | −41.18 |
| 2 | 45 | 0 | Sagittal | Gentle Glide Super | 5.43 | 19.68 | 6.63 | 21.99 | 4.77 |
| " | " | 4 | " | Gentle Glide Super | 7.67 | 22.98 | 3.62 | 18.34 | 3.29 |

As can also be seen from Table 2, the change in the center of mass coordinates is small, which indicates that there is very little movement (typically, only a few mm) of the tampon in the body of each of the participants, at least in these two cases.

Example 6

Additional Quantitative Image Analysis Examples using the GE AW Advantage Workstation Tables 3 and 4 below provide additional image analysis for MRI images to exemplify this invention further. These results were obtained from image analyses done for two different women in their twenties, both of whom had inserted Tampax Pearl Regular absorbency tampons. These tables provide three-dimensional coordinate data. The three dimensions are X (side-to-side or left to right direction), Y (the vertical, or bottom (inferior) to top (superior) direction) and Z (the front-to-back or anterior-posterior direction). Sign conventions are arbitrary, but important to understanding the exact location of these key features. Besides the tampon data, corresponding data for key anatomical features are also provided. Because women are not perfectly positioned in the MRI machine, these anatomical features provide "landmarks" for making slight (x, y, z) mapping corrections, so that the tampon features can be compared for one MRI session vs. another by using appropriate "triangulation" or mapping formulas.

TABLE 3

Key Coordinate Information from MRI/GE Workstation (Pearl Regular)

| | Feature | Avg. x value (L--> R) | Avg. Z value (A --> P) | Avg. Y value (I --> S) |
|---|---|---|---|---|
| 1 | Tip of Tailbone | 7.57 | −41.12 | −26 |
| 2 | Vaginal Introitus | 5.52 | 7.78 | −46.31 |
| 3 | External Cervical Os | 7.5 | −10.55 | −31.12 |
| 4 | Tampon Top Center | 22.63 | −13.38 | −25.83 |
| 5 | Tampon Bottom Center | 10.91 | 7.52 | −33.36 |

Also, in Table 3, note that the tampon is a few millimeters (mm) to the right of the cervical os, the source of bleeding, and the vaginal introitus. It is a few mm anterior of the introitus, but close to the os in an anterior/posterior sense, and the top is higher than the os, but the bottom of the tampon is lower than the os, a few mm above the introitus. No excessive leakage reported by this woman.

TABLE 4

Key Coordinate Information from MRI/GE Workstation (Pearl Regular Tampon)

| | Feature | X, left low to right high | Z, anterior low to posterior high | Y, feet low to head high |
|---|---|---|---|---|
| 1 | Tampon top, after insertion | 31.30 | −29.90 | 79.90 |
| 2 | Tampon top, 2 hr after insertion | 34.60 | −25.13 | 79.47 |
| 3 | Tampon top, 4 hr after insertion | 36.17 | −31.87 | 80.87 |
| 4 | Tampon bottom, after insertion | 24.70 | −15.00 | 34.80 |
| 5 | Tampon bottom, 2 hr after insertion | 28.00 | −6.03 | 31.07 |
| 6 | Tampon bottom, 4 hr after insertion | 20.17 | −9.17 | 33.97 |
| 7 | External cervical Os, avg. | 14.59 | −23.98 | 62.38 |
| 8 | Vaginal Introitus, avg. | 19.59 | −1.63 | 6.81 |
| 9 | Tailbone tip or coccyx, avg. | 23.42 | −59.93 | 60.24 |

In Table 4, note that the tampon above had moved slightly in body from immediately after insertion until four hours later. Corrections were made using the anatomical landmarks listed above, which, of course, do not move. The tampon is a few mm to the right of the external cervical os and vaginal introitus, a few mm anterior of the introitus, but close to the os in an anterior/posterior sense. Its top is slightly higher than the os, but the bottom of the tampon is lower than the os, but several mm higher than the introitus. No leakage reported by this woman.

Figure 17:
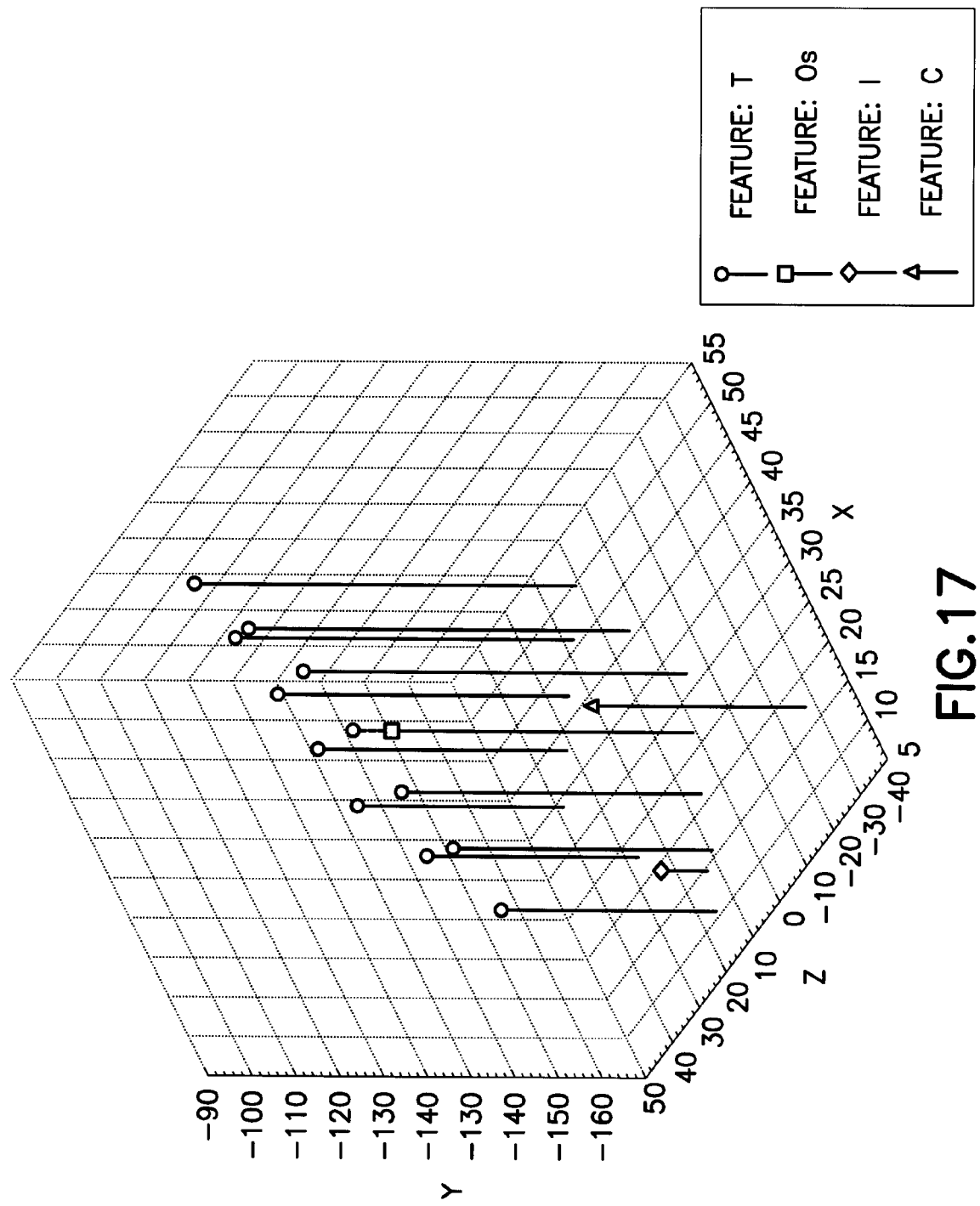
FIG. 17 provides a detailed view, using a three-dimensional scatterplot of coordinate information for a medical device and key anatomical features obtained from the GE Healthcare AW Advantage Workstation and then plotted using the Statistica (StatSoft, Tulsa, Okla.) statistical software package.

FIG. 17 provides a detailed view, using a three-dimensional scatterplot of coordinate information obtained from the GE Workstation and then plotted using the Statistica (StatSoft, Tulsa, Okla.) statistical software package. This plot was obtained for a woman in her forties that was using a Sport super absorbency tampon. As noted previously, the tampon is located high up on an angle to the right of, anterior to, and higher than that of the cervical os-vaginal introitus tieline. Even though the tampon was not perfectly positioned between the woman's external cervical os and her vaginal introitus, no leakage was reported with the Sport tampon. On the other hand, this same woman did report leakage on her questionnaire when wearing a similarly inserted, similarly positioned Tampax Pearl super absorbency tampon.

Figure 18:
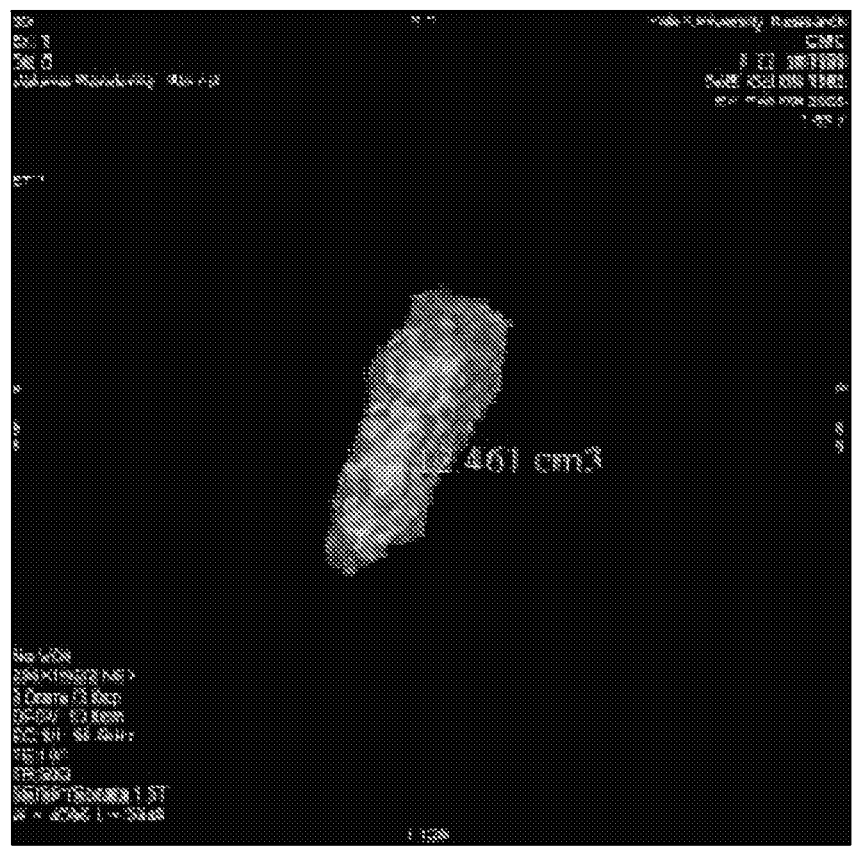
FIG. 18 provides a segmented plot of a Gentle Glide tampon after being worn for 4 hours by women in her early twenties, together with the volume, as obtained by the GE Healthcare AW Advantage Workstation.

FIG. 18 provides a segmented plot of a Gentle Glide tampon after being worn for 4 hours by women in her early twenties. The GE Workstation provides here the volume of the tampon, which was swollen to over 12 cubic centimeters after four hours of use. Note also how the color used in this scan indicates that some of the absorption was not homogeneous.

Figure 19:
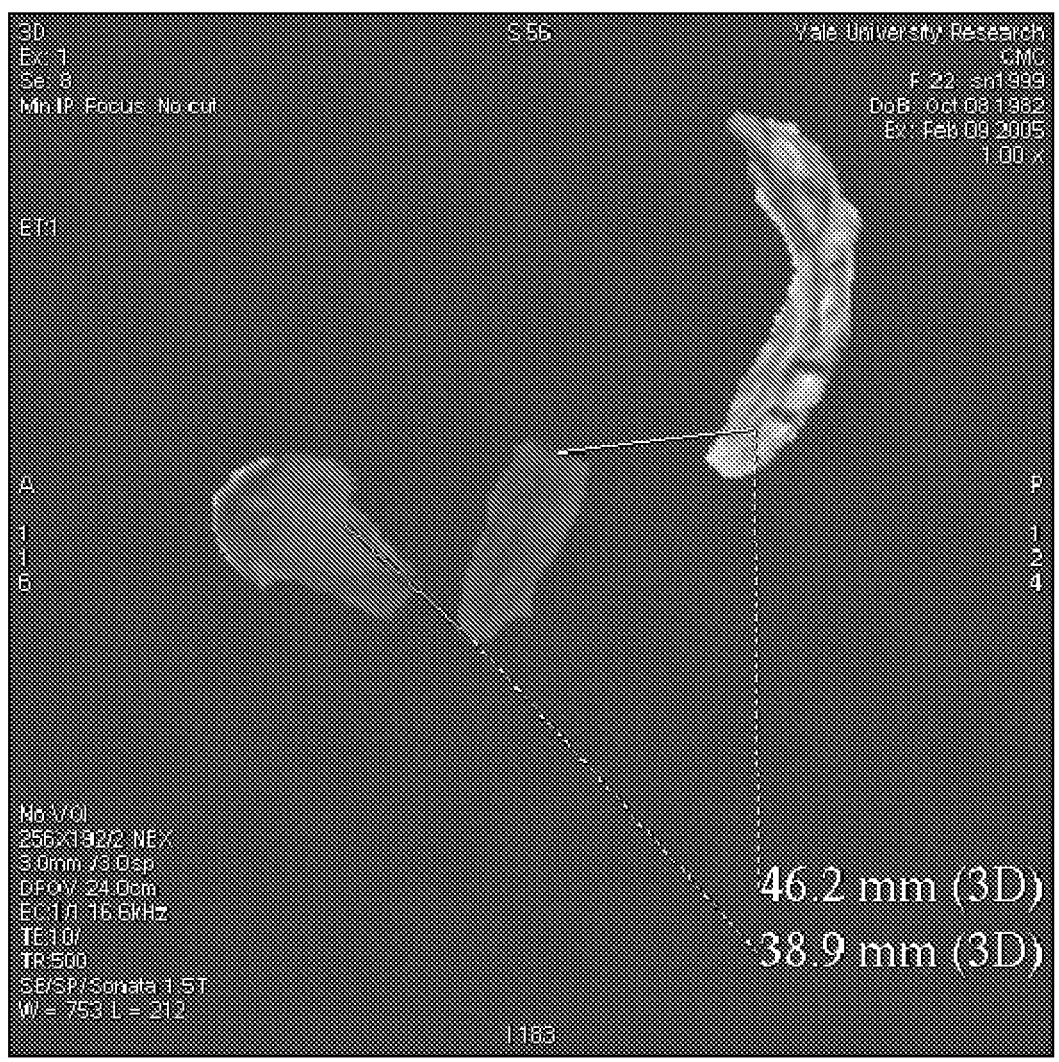
FIG. 19 provides a view of several segmented features from an MRI scan: the tailbone, the uterus and cervix and the tampon, as obtained by the GE Healthcare AW Advantage Workstation.

FIG. 19 provides a view of several segmented features from an MRI scan. One can note the tailbone, the uterus and cervix and the tampon. Also provided here, from the GE Workstation, are two key three-dimensional distances, one from the top of the tampon to the external cervical os and the other from the bottom of the tampon to the bottom-most plate of the tailbone. Such dimensions could be compared statistically for several woman-tampon combinations, using the combination of MRI scanning, image analysis, and statistical comparisons.

Many other key anatomical features can be determined by image analysis of MRI scans, particularly when the image analysis data like angles, lengths, widths and volumes are then linked to other software analysis tools such as Microsoft Excel, Statistica and similar data analysis packages. Such information provides guidance for comparing features of different tampons as well as for data-based design of new, novel tampons having improved comfort and leakage protection features, as a consequence of such analysis.

Example 7

Determination of Disease States and Abnormalities

Table 1 provides a summary of the disease states and abnormalities observed in one imaging study claimed by this invention.

In performing imaging scans, one participant did not know that her body had ovarian cysts the size of grapefruits. She was scanned three times, the third time after the cysts had been surgically removed.

Another participant exhibited anatomical "abnormalities" (in particular, a "split uterus"). Such abnormalities are not necessarily "disease states," but can be detected in MRI scans.

Adenomyosis, cervical cysts, endometriosis, uterine fibroids, and the like have also been observed mainly in older women, while menstrual cramping was observed in a teen-aged participant. In one woman, fibroids and an unusual uterine septum, i.e. the myometrium extended to the cervical os, was observed. The number and variety of disease states reported or observed here suggests that tampons with medicated and/or therapeutic benefits may certainly be a reasonable direction for feminine care products of the future.

Although this invention has been shown and described with respect to the detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention not be limited to the particular embodiments disclosed in the above detailed description, but that the invention will include all embodiments falling within the scope of the appended claims.

What is claimed is:

1. A method for evaluating the behavior and performance of a tampon in vivo, said method comprising the steps of:
   creating a database populated with information associated to a study of the performance of a tampon;
   qualifying one or more candidates as participants in said study for evaluating the performance of said tampon in vivo by subjecting said candidates to an evaluation process that determines the ability of said candidates to safely participate in said study and obtains consent from said candidates regarding said participation;
   determining detailed protocols and Magnetic Resonance Imaging (MRI) parameter settings relevant to said candidates and said study;
   providing an MRI operable in accordance with said protocols and MRI parameter settings and using said MRI to conduct one or more scans of each candidate;
   qualitatively analyzing said MRI scans with a computer having image analysis software, comprising at least one of a step of identifying anatomical structures proximate said tampon in said participant; observing said tampon over time; observing said tampon's influence on a vaginal wall of said participant; determining movement of said tampon within said participant; determining how a specific disease state influences tampon performance; and determining an indication of fluid absorption of said tampon;
   quantitatively analyzing at least a portion of said MRI scans by determining physical characteristics of said anatomical structures and tampons using a computer having image analysis software and data analysis and statistical software packages;
   at least one of said qualitative analysis and said quantitative analysis being performed using said software program;
   populating said database with information indicative of said quantitative and qualitative analyses; and
   wherein said participant is scheduled for MRI scanning more than once during her menstrual cycle and said participant is wearing a different tampon each time said participant is scheduled for an MRI scanning.

2. The method of claim 1, wherein said step of qualifying one or more candidates includes collecting information selected from said one or more candidates, said information including at least one of age, height, weight, current state of well-being, number of children delivered, hygiene practices, medical histories, birth control histories, characterizations of typical menstrual flows, handedness, and combinations of the foregoing.

3. The method of claim 1, wherein said one or more candidates for said study include at least three teenagers, at least two multiparous women of any age, and at least three perimenopausal women.

4. The method of claim 1, wherein said step of determining detailed protocols and MRI parameter settings includes at least one of sequencing imaging scans to define appropriate anatomical features, timing imaging scans, determining pulse times, and determining spin echo parameters.

5. The method of claim 1, wherein said step of determining detailed MRI protocols and parameter settings includes determining time interval relative to the placement of said tampon.

6. The method of claim 5, wherein the time intervals relative to the placement of said tampon include planning scans prior to the insertion of said tampon and after insertion of said tampon.

7. The method of claim 1, wherein said one or more scans includes one or more sagittal scans, one or more transaxial scans, and one or more coronal scans.

8. The method of claim 1, wherein said step of providing an MRI operable in accordance with said protocols and MRI parameter settings and using said MRI to conduct one or more scans of each candidate includes providing a plurality of scans, each scan consisting of a localizer gradient echo sequence followed by three orthogonal planes of fast spin echo T2-weighted scans through said tampon.

9. The method of claim 8, further comprising providing a plurality of axial T1-weighted imaging scans.

10. The method of claim 1, wherein said step of quantitatively analyzing at least a portion of said MRI scans comprises segmenting at least two images of said scanned participant.

11. The method of claim 1, further comprising using data from said step of quantitatively analyzing at least a portion of said MRI scans by determining physical characteristics to product at least one of a vaginal cavity mold and a tampon using rapid prototyping.

12. The method of claim 1, further comprising the steps of:
    using the MRI to create a surface model image of said tampon in vivo from two or more two-dimensional cross section images of said tampon in vivo; and combining said surface model image of said tampon in vivo with a second surface model image to produce a single image, said section surface model image is at least one of said tampon in vivo and an anatomical structure proximate said tampon in vivo,
    wherein said single image depicts a position of said tampon in a vaginal cavity, a shape of said vaginal cavity with said tampon inserted, and a shape of said tampon inserted in said vaginal cavity.

13. The method of claim 12, further comprising using software to export said surface model image to a computer-readable format.

14. The method of claim 12, further comprising making a quantitative analysis of a measurement of at least one of said tampon in vivo and said anatomical structure.

15. The method of claim 12, further comprising making a qualitative analysis regarding said tampon in vivo.

16. The method of claim 12, further comprising using rapid prototyping to produce at least one of a vaginal cavity mold and a tampon for use in a study of the performance of tampons.

17. The method of claim 1, wherein said participant is scheduled three or more times during her menstrual cycle.

18. The method of claim 1 wherein said step of qualitatively analyzing said MRI scans further comprises the step of recording one or more of the signal behavior, expansion, and position of the tampon relative to the external outer surface of the cervix of the participant.

19. The method of claim 1, wherein said participant is scheduled for an MRI on the second day of her menstrual cycle.

20. The method of claim 12, further comprising the step of identifying the distance from the top of the tampon to the external cervical os.

21. The method of claim 12, further comprising the step of identifying the distance from the bottom of the tampon to the bottom-most plate of the tailbone.

\* \* \* \* \*